United States Patent
Sternowski

(10) Patent No.: US 11,435,387 B1
(45) Date of Patent: Sep. 6, 2022

(54) MICROWAVE ENERGY DETECTOR

(71) Applicant: Softronics, Ltd., Marion, IA (US)

(72) Inventor: Robert H. Sternowski, Cedar Rapids, IA (US)

(73) Assignee: SOFTTRONICS, LTD., Marion, IA (US)

(*) Notice: Subject to any disclaimer, the term of this patent is extended or adjusted under 35 U.S.C. 154(b) by 0 days.

(21) Appl. No.: 17/497,097

(22) Filed: Oct. 8, 2021

Related U.S. Application Data

(60) Provisional application No. 63/231,128, filed on Aug. 9, 2021.

(51) Int. Cl.
G01R 29/08 (2006.01)
F41H 11/00 (2006.01)

(52) U.S. Cl.
CPC .......... *G01R 29/0885* (2013.01); *F41H 11/00* (2013.01)

(58) Field of Classification Search
CPC ............................ G01R 29/0885; F41H 11/00
USPC ........................................................ 324/697
See application file for complete search history.

(56) References Cited

U.S. PATENT DOCUMENTS

| | | | | |
|---|---|---|---|---|
| 2012/0293067 A1* | 11/2012 | Neate | ...................... | H01Q 1/26 315/39 |
| 2019/0178839 A1* | 6/2019 | Lyford | ..................... | B01L 3/502 |
| 2020/0068672 A1* | 2/2020 | Ghandi | ................... | B01J 19/126 |
| 2020/0259237 A1* | 8/2020 | Shrivastava | ............ | G02F 1/163 |

OTHER PUBLICATIONS

Jacobsen, Svein, and Oystein Klemetsen. "Improved detectability in medical microwave radio-thermometers as obtained by active antennas." IEEE Transactions on Biomedical Engineering 55.12 (2008): 2778-2785. (Year: 2008).*

Croizer, Mathieu, et al. "Control of shielding effectiveness of optically transparent films by modification of the edge termination geometry." IEEE Transactions on Electromagnetic Compatibility 62.6 (2020): 2431-2440. (Year: 2020).*

* cited by examiner

Primary Examiner — Christopher P McAndrew
(74) Attorney, Agent, or Firm — Shuttleworth & Ingersoll, PLC; Jason R. Sytsma

(57) ABSTRACT

A Faraday enclosure for substantially attenuating microwave-frequency fields outside the Faraday enclosure. Information to and from the circuitry inside the Faraday enclosure is accessible by input pinholes and output pinholes, respectively. A sensor positioned outside of the Faraday enclosure and aligned with the first input pinhole senses microwave-frequency fields. A receiver inside the Faraday enclosure aligned with the input pinhole and the sensor responds to the sensor.

20 Claims, 4 Drawing Sheets

MICROWAVE ENERGY DETECTOR

CROSS-REFERENCE TO RELATED APPLICATIONS

The present application claims the benefit of and priority to U.S. Provisional Application No. 63/231,128 filed Aug. 9, 2021, which is incorporated herein by reference.

TECHNICAL FIELD

This disclosure relates to the detection of microwave energy, and, more specifically, this disclosure is directed to a microwave energy detector that can withstand exposure to and alert in the presence of high intensity electromagnetic fields.

BACKGROUND INFORMATION

The cumulative effects of "silent" Directed Energy Weapons (DEW) to civilian and military personnel is of growing concern as capabilities expand. These weapons focus high level of non-ionizing electromagnetic energy fields on both equipment and personnel (Ionizing radiation is a product of nuclear fission, which is NOT part of DEW effects). While equipment effects are relatively well established and detectable/preventable, effects on human tissue are more indeterminate. The primary effect is dielectric heating of tissue, and secondary cellular damage stemming from that heating. Especially troublesome is uncertainty that the cumulative amount of radiation exposure may be a significant health issue.

Concern over radio energy radiation injury to military personnel has been growing with the increased use of enemy directed non-ionizing energy weapons. Once considered an emerging battlefield weapon, current events suggest that DEWs may be responsible for the "Havana Syndrome", which has affected civilian personnel in international urban areas. The silent and hitherto undetectable nature of this threat has caused significant alarm in the Government community. Most significantly, the effects appear to be cumulative, and indistinguishable from other types of injuries. Thus, it is important to first know when a DEW is in use, and secondarily to collect exposure information in order to correlate, recognize and pursue the source, exposure, symptoms and treatment necessary to protect the health of personnel. Key is establishing when exposure occurs and to what extent.

Accordingly, there is a need for methods and devices that can measure, log, and track the amount of electromagnetic exposure.

SUMMARY

In accordance with one aspect of the present invention, disclosed is a microwave energy detector comprising a Faraday enclosure for substantially attenuating microwave-frequency fields outside the Faraday enclosure. Information to and from the circuitry inside the Faraday enclosure is accessible by input pinholes and output pinholes, respectively. The pinholes are designed in such a manner as to allow transfer of information while not allowing microwave-frequency fields into the Faraday enclosure. A sensor positioned outside of the Faraday enclosure and aligned with the first input pinhole senses microwave-frequency fields. A receiver inside the Faraday enclosure aligned with the input pinhole and the sensor responds to the sensor.

In an embodiment, the sensor is a gas bulb responsive to microwave-frequency fields above a threshold. The receiver can be implemented as a photovoltaic transistor. The sensor/gas bulb can be separated from the receiver by an air gap in the first input pinhole. The gas lamp can be tuned to respond to microwave-frequency fields exceeding a threshold level by varying a length of the leads that extend from the bulb of the gas lamp. The gas lamp can also be tuned by a Faraday sleeve partially covering the gas lamp where the threshold level is changed by varying the amount of the gas lamp that is covered by the Faraday sleeve. In such embodiments, the gas lamp is a passive EM sensor that is responsive to the presence of microwave-frequency fields without a power supply.

In an embodiment, a microprocessor communicatively coupled to the photovoltaic transistor is provided to store information corresponding to responses by the photovoltaic transistor to light from the gas lamp. The microprocessor can comprise an optical serial output aligned with the output pinhole to retrieve information from the microprocessor. In such embodiments, a clock can be connected to the microprocessor to align responses received by the microprocessor from the photovoltaic transistor to light from the gas lamp with a point in time. Nonvolatile memory can be connected to the microprocessor for storing information from the microprocessor.

In an embodiment, an alarm can be connected to the photovoltaic transistor to respond to microwave-frequency fields exceeding the threshold levels. The alarm can be an audible alarm or a visible alarm. In alternative embodiments, the alarm can be connected to the microprocessor to respond in the same manner.

BRIEF DESCRIPTION OF THE DRAWINGS

These and other features and advantages of the present invention will be better understood by reading the following detailed description, taken together with the drawings wherein.

DETAILED DESCRIPTION OF THE PREFERRED EMBODIMENTS

Figure 1:
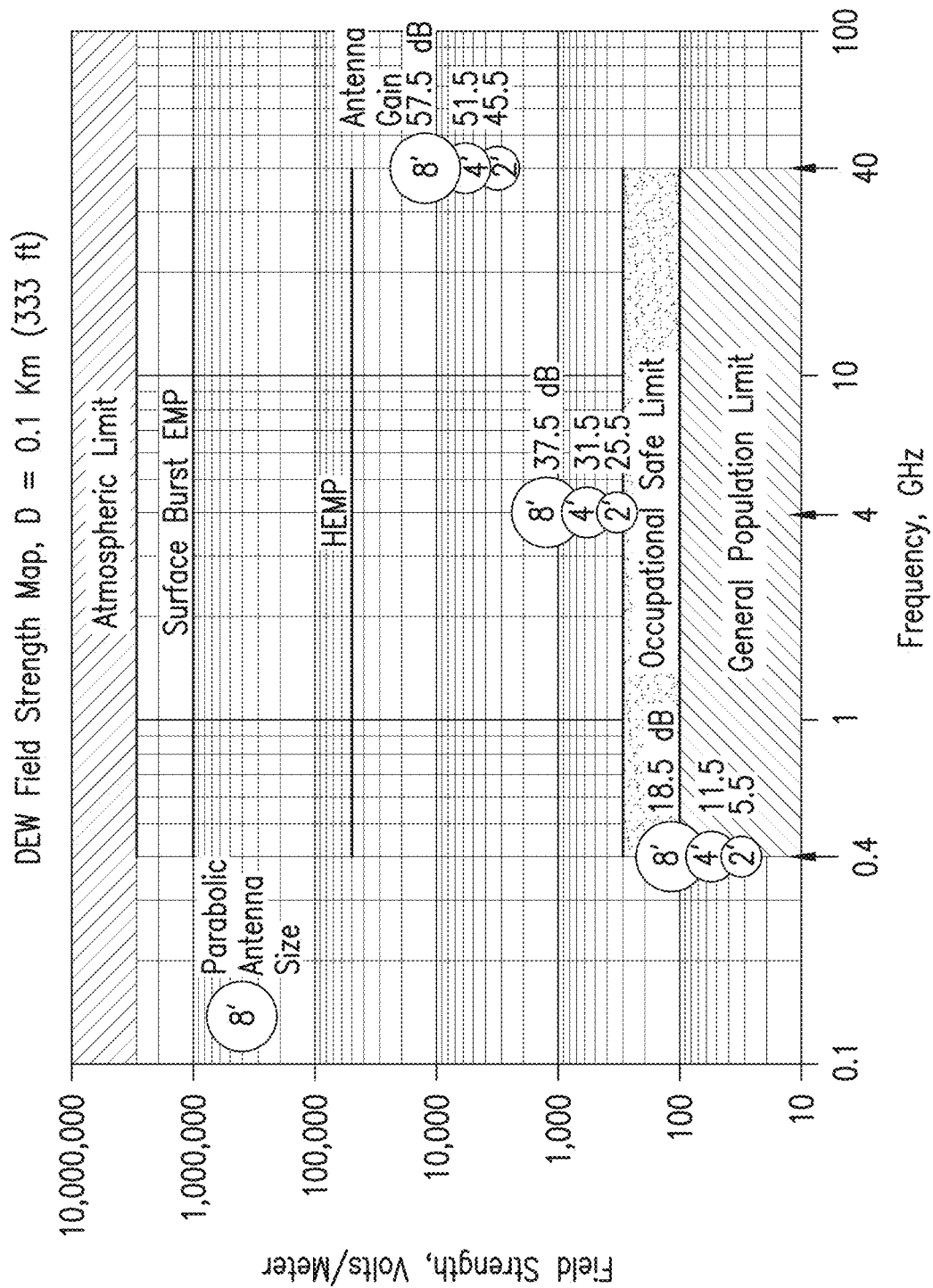
FIG. 1 is a graph showing the field strength at varying frequencies at a distance of 0.1 Km from the source.

Disclosed are methods and devices that can measure, log, and track the amount of electromagnetic exposure, in particular exposure to a directed energy weapon (DEW). A DEW is a high-power microwave radio transmitter. For maximum effectiveness, efficient parabolic antennas to focus and direct EM energy are generally necessary for sufficient level of effectiveness as a weapon. Signals from such DEWs are subject to the square law power diminution and straight-line path behavior of all radio signals, which means the distance from the source to the target is particularly relevant in designing a suitable detector.

Also particularly relevant to designing a suitable detector are the lower and upper limits. As a weapon against person, human tissue damage, with some organs such as retinas, reproductive organs being more susceptible to heating than others, is a function of tissue heating due to average power, not peak power. Peak power is not known to be relevant to human health, but damages electronics. To determine average power, power is generally averaged over 6 minutes (0.1 hour) with radiation limits being specified for 0.1 hour average. The "average safe" exposure for the general public in the UHF and Ka bands is approximately 100 v/m (rounded for simplicity of calculation). "Safe occupational" radiation exposure in the same bands, that is, for someone working non-continuously on equipment in those bands, is 10 dB higher, rounded to 300 v/m. None of the international specifications provide any indication of radiation limits beyond the safety thresholds. As an upper limit, atmospheric break down with ionization and arcing occurs at a field strength of 3,000,000 v/m. As points of comparison, the EMP burst from a surface nuclear detonation at 10-20 miles above ground produces on the order of 1,000,000 v/m field strength, and a high altitude EMP burst (HEMP) at 200-400 km above ground produces on the order of 50,000 v/m field strength. It is well known such EMP bursts damages electronic equipment.

Based on the foregoing, the DEW range of concern is approximately a 500-50,000 v/m field strength illumination on the target (approximately 40 db range). In order to develop the methods and devices described herein, testing was carried out based on several assumptions. To produce such a field strength, a 2, 4, or 8 ft. diameter parabolic antenna was used. These antennas are the most efficient and compact form of focusing antenna for a given frequency. The gain varies by 6 db for each factor of two change in diameter, which means that the gain is easy to scale for antennas of other sizes. For testing purposes, the gain ranged from 5.5 dB at 0.4 GHz for a 2-foot parabolic antenna to 57.5 dB at 40 GHz for an 8-foot parabolic antenna. Antenna gain is important because it effectively "amplifies" the transmitter output power by virtue of concentrating the radio energy in a small spot.

For testing purposes the antenna source of the DEW was tested at 0.1 km (333 feet) and 1 km (3333 feet) from the target. These lower and upper bounds of distance are considered prime tactical ranges, as the alternative is either too close to the target making the source easy to spot or too large of an antenna or too large of a power source to create the effective EM field. For testing, frequencies of 0.4 GHz, 4 GHz, and 40 GHz with a decade-based spread of channels was used.

Figure 2:
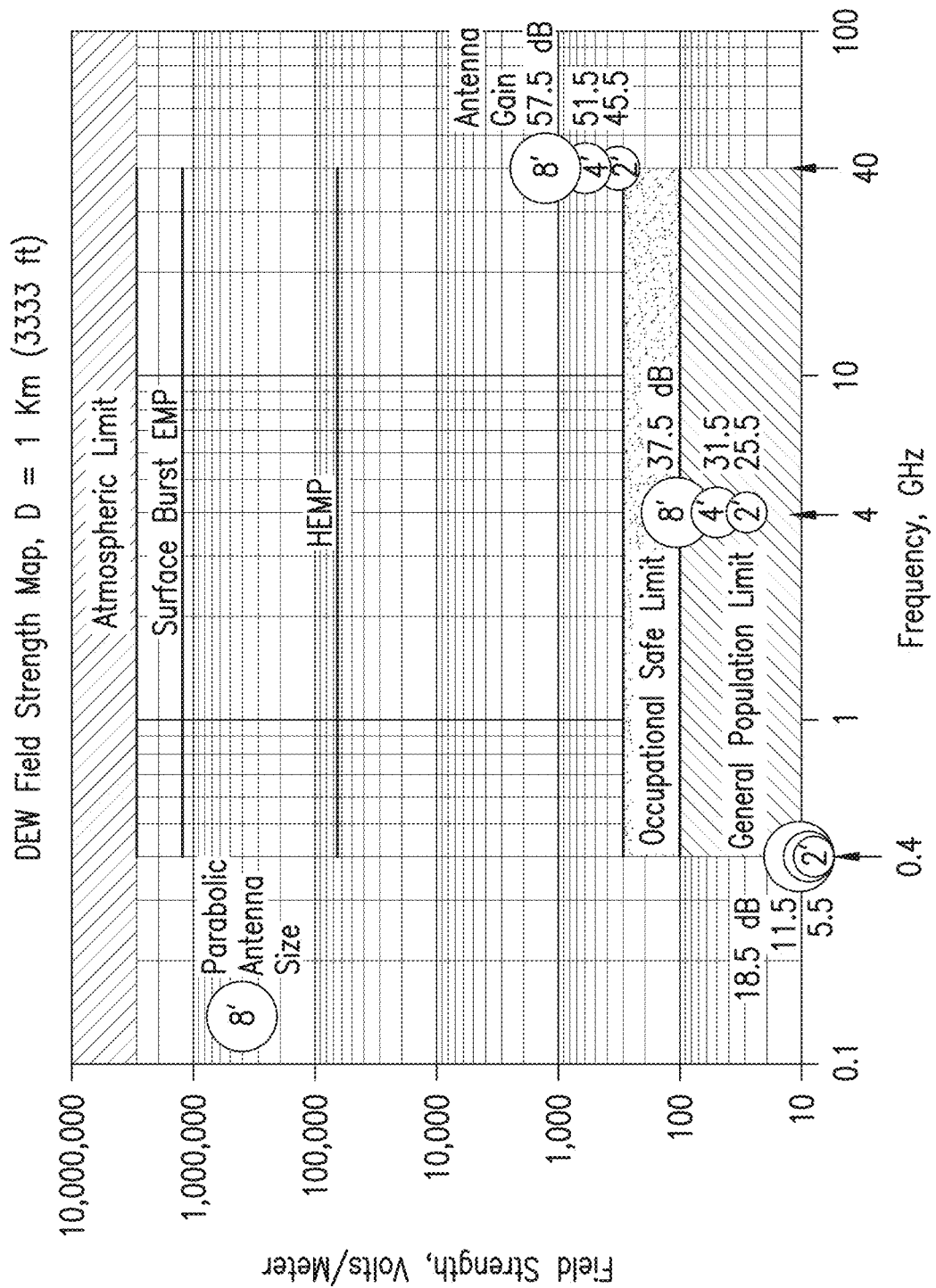
FIG. 2 is a graph showing the field strength at varying frequencies at a distance of 1.0 Km from the source.

FIGS. 1-2 show field strength maps for 0.1 Km and 1 Km from source to target, respectively. While there are five variables comprising field strength, frequency, distance between antenna and target, antenna gain, and signal power, FIGS. 1-2 comprise distinct distances from the DEW antenna to victim, and shows the energy field (v/m) at the target on the y-axis versus frequency on the x-axis. The graphs further show the antenna size with gain for each of the 2, 4, and 8 inch parabolic antennas plotted for field strength and frequency. Each of these graphs shows the expected field strength versus four independent variables. The atmospheric and EMP/HEMP limits, as well as the regulatory "safe" maxima, are overlaid for reference. The energy maps shown assume a DEW transmitter output to the antenna of 100,000 watts (100 KW).

Focusing on FIG. 1, shown is the graph that represents the threat to a victim/target 0.1 km (100 m) from the parabolic antenna source with 0.1 KW microwave-frequency generator. Identical antenna sizes are used for all three frequencies, with the numeric antenna gain displayed next to the antenna symbols. The Effective Isotropic Radiated Power (EIRP) of each DEW (0.1 MW=50 dBW, "Decibels greater than 1 watt") equals the generator power plus antenna gain.

From FIG. 1, one can conclude that 0.4 GHz barely produces enough field strength to exceed the occupational safety threshold, even at 0.1 km spacing and using an 8-foot parabolic antenna, which is not an especially covert or discrete antenna. 4 GHz delivers approximately 1200 v/m with an 8-foot parabolic antenna, which is likely to cause tissue heating. 40 GHz, with an 8 foot parabolic, produces approximately the same field strength as a 50,000 v/m HEMP burst, which will cause significant damage to unprotected electronic equipment and significant tissue heating if sustained. The postulated DEWs are still 30 dB below the atmospheric limitation and 20 dB below the field from a surface burst E1 EMP wave.

For purposes of estimating and extrapolating effects and interrelationships from the testing carried out to develop the graph of FIG. 1, consider the following: (i) if the microwave-frequency generator power is increased 10 dB (10×), the resulting field strength also increases 10 dB (~3×); (ii) if the parabolic antenna diameter is changed, the gain changes 6 dB for a field strength factor of 2× and by 20 dB for a field strength factor of 10× (square law); (iii) if the frequency is increased by 10× and the parabolic antenna diameter held constant, the gain of the parabolic antenna increases by 20 dB because shrinking the wavelength effectively increases the diameter of the parabolic antenna relative to what it was at the lower, longer wavelength; and (iv) if the distance from antenna to victim changes by 10×, the v/m field strength changes by 20 dB by virtue of the square law.

FIG. 2 is identical to FIG. 1 but with a 1 km spacing from the source to the victim. The field v/m generated is 10× less than the field of FIG. 1 and the maximum occurs (about halfway between "safe" and HEMP v/m levels) at 40 GHz. 0.4 and 4 GHz are poor DEW channels that produce very little field strength at the victim with a 100 KW DEW and various size antennas.

Based on the foregoing testing carried out to develop the graphs of FIG. 1 and FIG. 2, the most important conclusion is that the microwave energy detector need only be concerned with measuring field strengths above the "safe" threshold (300 v/m) and a little above the HEMP level (50,000 v/m). For rounding purposes, an objective measurement range of 1000 to 100,000 v/m (and any value in between), which is a dynamic range of 40 dB is useful.

The frequency ranges of interest are VHF through 1 THz frequency ranges (and any frequency within that range). For purposes of this disclosure microwave frequencies means all frequencies between the VHF through 1 THz frequency ranges, inclusive. The microwave energy detector herein described is intended to be construed as a detector responsive to microwave-frequency fields throughout this range.

Figure 3:
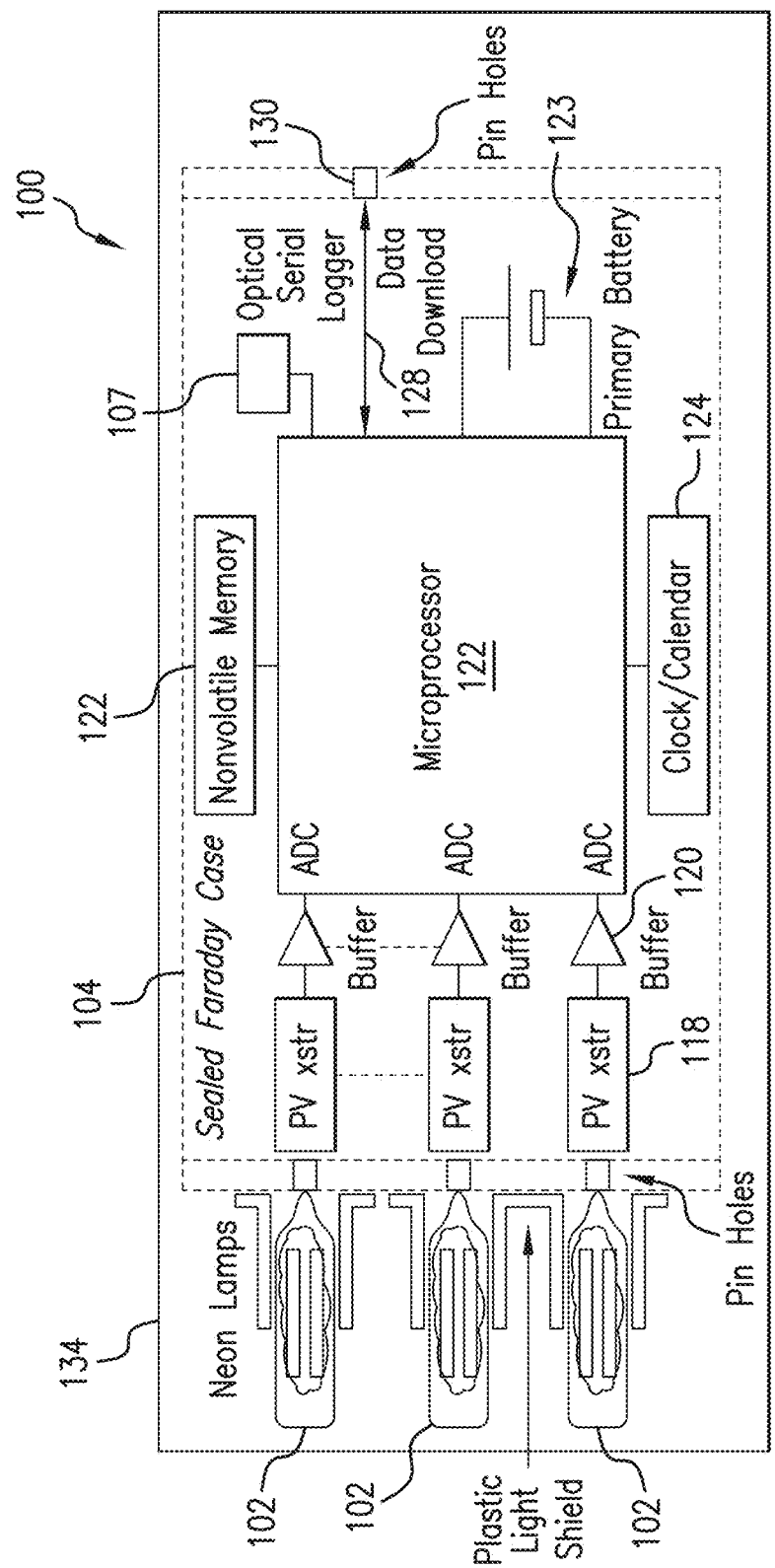
FIG. 3 is a block diagram of a microwave energy detector according to this disclosure.

With the microwave energy detector boundary conditions defined, a microwave energy detector is disclosed that can withstand a brief broadband blast of high intensity electromagnetic energy and a continuous narrow spectrum blast from a DEW. FIG. 3 shows a microwave energy detector 100, according to an embodiment of this disclosure. Microwave energy detector 100 comprises of a passive, ultra-broadband, microwave energy sensor 102 that is electrically and physically isolated from the electronics inside a Faraday enclosure 104 that completely surrounds the internal electronics. When the signal is greater than a preset threshold (which is correlated to impinging field strength), an alarm 107 can be triggered to alert the wearer that he/she is being "illuminated" by a DEW and to take evasive action.

Figure 4:
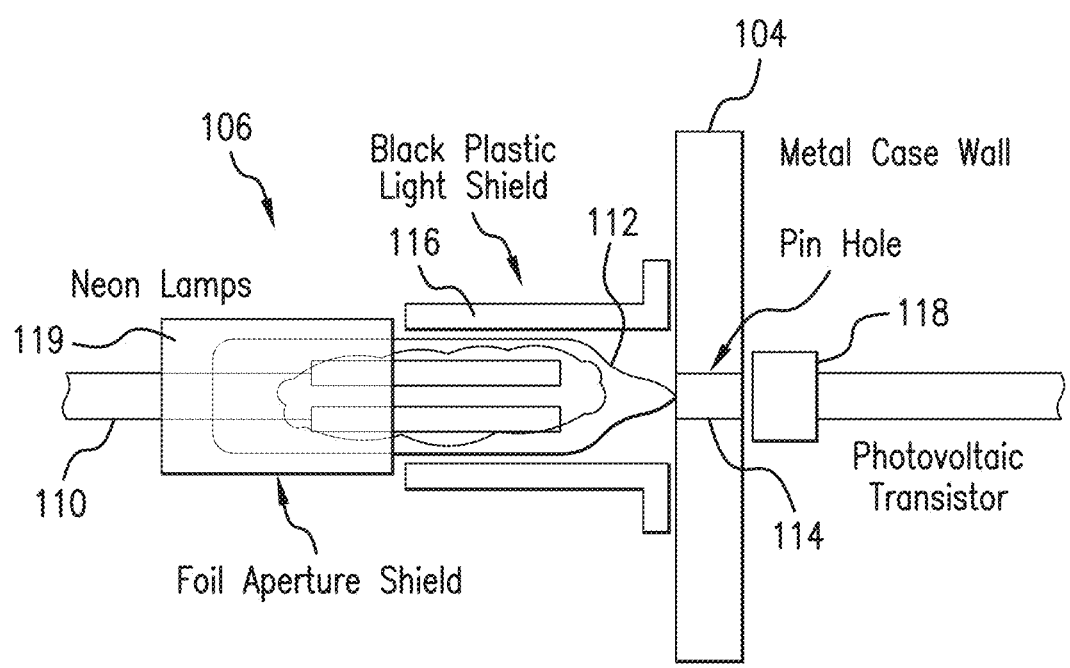
FIG. 4 is an illustration of the EM sensor aligned with the photovoltaic transistor of FIG. 3.

Focusing on sensor 102, as more particularly illustrated in FIG. 4, sensor 102 can be implemented as a gas lamp assembly 106 comprising a gas lamp 108 formed with a pair of lead 110 extending from a hermetically sealed glass bulb 112 containing a Noble gas that glows when exited by an electromagnetic field. A commonly available gas lamp 108 is a Neon gas lamp 108, but any gas lamp 108 that excites in the presence of a EM field will suffice. Gas lamp 108 is appropriately positioned with leads 110 extending outward and bulb 112 proximate an input pinhole 114 in Faraday enclosure 104 with an air gap in input pinhole 114 to effectively couple light from gas lamp 108 to an optical transistor, or other optical receiving component inside Faraday enclosure 104. The Noble gas inside gas lamp 108 will glow in the presence of an EM field meeting a sufficient threshold. Gas lamp 108 does not vary significantly in brightness vs. field level making it a binary sensor—it is either, on and glowing in the presence of a field level meeting a sufficient threshold being a function of the atomic properties of Neon, or it is off. The light from gas lamp 108 (suitably isolated from ambient light) is applied through input pinhole 114 in Faraday enclosure 104 containing the sensor active electronics (including battery) and sensed by a photovoltaic transistor. Gas lamp 108 can be implemented as a standard, miniature Neon, NE2 lamp.

Gas lamp assembly 106 is positioned with bulb 112 aligned with input pinhole 114 and surrounded by a microwave translucent, light opaque shield 116 to block extraneous light from entering input pinhole 114. Shield 116 can be made of dark or black plastic or other material that won't attenuate the EM field in the threshold ranges of interest.

Gas lamp assembly 106 is tunable to react to an EM field of various thresholds in two mutually inclusive ways. First, leads 110 are effectively an antenna for gas lamp 108 where the frequency of the antenna is tuned by varying the length of leads 110 from stock length down to zero. The variations can be determined based on length of leads where the shorter the lead the less sensitive sensor 102 is to EM fields. Removing the portion of leads 110 extending from glass bulb 112 and leaving only the portion of leads 110 inside bulb 112 (about 0.10 inches) results in low sensitivity.

Second, a Faraday sleeve 119 can be applied to cover varying portions of an outer portion bulb 112. Faraday sleeve 119 attenuates the microwave energy fields around portion of bulb 112 that is covered effectively tuning the threshold range of activation of gas lamp 108 from most sensitive without Faraday sleeve 119 to least sensitive when completely covered. Faraday sleeve 119 can be implemented as an adhesive metal foil sleeve. Completely enclosing gas lamp 108 in aluminum EMI foil, except for the tip of bulb 112 for light to escape can prevent illumination under any conditions. Removing small patches of the foil enclosure varies the observed sensitivity of gas lamp 108. Based on this, the sensitivity of sensor 102 implemented as gas lamp assembly 106 can be varied with lead length and/or aperture into bulb 112.

Sensor 102 should be responsiveness to energy beyond Ka-band. Sensor 102 implemented as gas lamp assembly 106 can be operated in a passive manner meaning no power or support circuitry is required for sensor 102 making it indestructible by an EMP or DEW. The gas inside bulb 112 is ionized by the microwave field. A plurality of sensors 102 with sensitivity threshold levels can be provided. In an embodiment, three sensors 102 each implemented as gas lamp assembly 106 and tuned to 1000 v/m, 10,000 v/m, and 100,000 v/m, respectively, offers a full-range of alerts. The sensitivity thresholds for the bottom, mid and high frequency points of the desired frequency band can be set at any threshold levels of interest.

As previously stated, sensor 102 is electrically and physically isolated from the electronics inside Faraday enclosure 104. Sensor 102 implemented as gas lamp assembly 106 has its bulb 112 of gas lamp 108 aligned with input pinhole 114 in Faraday enclosure 104 so that light can enter into Faraday enclosure 104. Input pinhole 114 is less 1/10 the wavelength of the highest frequency of concern. The pinhole through the Faraday shield protecting the electronics in practice functions as a waveguide beyond cutoff frequency. The diameter and depth of the hole comprises a high-pass filter. No electromagnetic energy below the cutoff frequency can pass through the hole. By making the hole small enough to define a cutoff frequency higher than all threatening frequencies, only electromagnetic waves, such as light, can propagate through the hole. This protects the internal electronics from damaging frequencies while allowing optical communication through Faraday enclosure 104.

In practice, the highest frequency of concern is 200 GHz, which has a wavelength of 0.10 inches, which corresponds to a diameter of 0.010 inches for input pinhole 114. Input pinhole 114 of this size will attenuate all frequencies below this range. Further attenuation of 20-40 db can be added with an adhesive micromesh while maintaining 64% optical transparency. Even further pinhole attenuation can be added by elongating input pinhole 114 in accordance with standard practice for "waveguide-beyond-cutoff" design principles. For purposes of this disclosure, a completely sealed Faraday enclosure 104 means an enclosure that attenuates all or substantially all microwave frequencies yet still allows electromagnetic waves in the optical spectrum through, at least in defined locations, such as input pinhole 114 and output pinhole 130.

Input pinhole 114 creates an air gap between sensor 102 and the electronics inside Faraday enclosure 104. This air gap provides electrical and physical isolation between the sensor 102 and the internal electronics while allowing optical information to flow into and out of Faraday enclosure 104.

On the opposite side of input pinhole 114 aligned with sensor 102 is a receiver 118 for responding to the light output of sensor 102. Receiver 118 can be implemented as a transmission line, antenna, transistor, or other receiver component inside Faraday enclosure 104 that can receive information from sensor 102 while remaining electrically isolated. With sensor 102 implemented as an optical device, receiver 118 can be implemented as a photovoltaic transistor and positioned proximate to or against the inner wall of Faraday enclosure 104 aligned with input pinhole 114. In this manner, light from sensor 102 is communicated through the air gap in input pinhole 114 to receiver 118 implemented as the photovoltaic transistor.

The signal from receiver 118 is separated from a microprocessor 122 by a buffer 120 to translate the signal from receiver 118 to the input to microprocessor as a distinct on/off signal. Microprocessor 122 is powered by a power supply 123 (preferably a long lasting Lithium ion battery) inside Faraday enclosure 104 and can be configured as a nonvolatile data logger circuit that receives a plurality of signals from a corresponding plurality of tuned sensors 102. A clock/calendar circuit 124 can be provided to provide timing information at regular intervals to correspond with the plurality of signals received by the data logger circuit in microprocessor 122. In one implementation, clock/calendar circuit 124 implemented in an integrated circuit can provide +/−30 seconds accuracy per year with 45 nano-amps of current The data log will include records showing the time/date of each radiation epoch. Pulse trains of logged data in the occurrence of a DEW attack could overload the data logger, so a firmware "filter" can be implemented to determine when a train of pulses is encountered and make a log entry indicating a period of pulses rather than "clogging" the data log with a record for each pulse.

The logged data can be stored in nonvolatile memory 126 connected to microprocessor 122. This allows later mining of data to determine patterns of DEW activity and exposure. Logged data is extracted through a protected optical bus 128 through an output pinhole 130 Faraday cage.

An optical output port to microprocessor 122 can be provided and aligned with an output pinhole in Faraday enclosure 104. This allows for the download of logged data from microprocessor 122 via digital optical communication while protecting the electronic circuitry from the ingress of DEW energy.

Alarm 107 can be connected directly to receiver 118 or connected to microprocessor 122. In either case, alarm 107 is configured to activate in response to the presence of a field of a certain threshold level. Alarm 107 can be an optical alarm, such as LEDs, or an audible alarm, such as a piezo buzzer, or a combination of both optical and audible alarms. This way the wearer can take evasive action in response to a DEW attack.

Microwave energy detector 100 can be located inside a plastic case 134 to protect sensor 102. Microwave energy detector 100 is approximately the size of a USB memory stick and weighs less than an ounce. Owing to the small size, microwave energy detector 100 can be worn continuously by service personnel using an integral badge clip, around the neck as a lanyard, placed in pockets, or attached to clothing or protective gear, such as flak jackets or the like. Microwave energy detector 100 is "always on" (no on/off switch), because of the nanoamperes of power consumption, providing around-the-clock DEW monitoring. The battery rarely needs to be changed. This means it is possible to track exposure microwave energy fields over a person's entire service time.

Microwave energy detector 100 can detect microwave signals, but there is an important caveat. The human body is 95% salt water, and as such will increasingly attenuate or reflect radio signals as the frequency rises. While microwave energy detector 100 is designed for omnidirectional sensing when it is positioned obstruction-free, positioning it on one side of an attenuating or reflecting object, including a human body will cause it to sense signals only from the open direction. This could deliberately be used as a direction finding means of locating the DEW, since the alarm will stop when the body is between the source of the DEW and microwave energy detector 100. Microwave energy detector 100 is small enough that one could carry one on each side of the body.

Microwave energy detector 100 provides continuous detection and logging of a DEW attack in the VHF through 1 THz range with an "Air gapped" broadband passive sensor 102. All vulnerable circuitry and battery are located inside a sealed Faraday enclosure using components with very low power consumption, in the nano-amps range, powered by a long life lithium primary battery. Information can be stored and later accessed with a similar air gapped optical serial output port.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

I claim:

1. A microwave energy detector comprising:
   a Faraday enclosure for substantially attenuating microwave-frequency fields outside the Faraday enclosure, wherein the Faraday enclosure comprises a first input pinhole;
   a sensor positioned outside of the Faraday enclosure and aligned with the first input pinhole for sensing microwave-frequency fields; and
   a receiver inside the Faraday enclosure aligned with the first input pinhole and the sensor for responding to the sensor, wherein the sensor is physically and electrically isolated from the receiver.

2. The microwave energy detector of claim 1, wherein the sensor produces light when energized by microwave-frequency fields and the receiver responds to the light from the sensor.

3. The microwave energy detector of claim 2, and further comprising an alarm connected to the receiver.

4. The microwave energy detector of claim 3, wherein the alarm is an audible alarm or a visible alarm.

5. The microwave energy detector of claim 1, and further comprising a microprocessor communicatively coupled to the receiver to store information corresponding to responses by the receiver to information from the sensor.

6. The microwave energy detector of claim 5, and further comprising a clock connected to the microprocessor to align responses received by the microprocessor from the receiver to information from the receiver with a point in time.

7. The microwave energy detector of claim 6, and further comprising nonvolatile memory connected to the microprocessor for storing information from the microprocessor.

8. The microwave energy detector of claim 5, wherein the microprocessor further comprises an optical serial output, wherein the Faraday enclosure further comprises a first output pinhole, and wherein the optical serial output of the microprocessor is aligned with the first output pinhole of the Faraday enclosure.

9. The microwave energy detector of claim 1, wherein the sensor is separated from the receiver by an air gap in the first input pinhole.

10. The microwave energy detector of claim 9, wherein the sensor is a gas lamp that emits light in the presence of the microwave-frequency fields and the receiver is a photovoltaic transistor.

11. A microwave energy detector comprising:
   a Faraday enclosure for substantially attenuating microwave-frequency fields outside the Faraday enclosure, wherein the Faraday enclosure comprises a first input pinhole;
   a sensor positioned outside of the Faraday enclosure and aligned with the first input pinhole for sensing microwave-frequency fields; and
   a receiver inside the Faraday enclosure aligned with the first input pinhole and the sensor for responding to the sensor, wherein the sensor is separated from the receiver by an air gap in the first input pinhole, wherein the sensor is a gas lamp that emits light in the presence of the microwave-frequency fields and the receiver is a photovoltaic transistor, and
wherein the sensor is tunable to respond to microwave-frequency fields exceeding a threshold level.

12. The microwave energy detector of claim 11, wherein the gas lamp further comprises leads, and wherein the gas lamp is tunable to the threshold level by varying a length of the leads.

13. The microwave energy detector of claim 11, and further comprising a Faraday sleeve partially covering the gas lamp, and wherein the gas lamp is tunable to the threshold level by varying the amount of the gas lamp that is covered by the Faraday sleeve.

14. The microwave energy detector of claim 10, wherein the gas lamp is a passive sensor that is responsive to the presence of microwave-frequency fields without a power supply.

15. A microwave energy detector comprising:
a Faraday enclosure for substantially attenuating microwave-frequency fields outside the Faraday enclosure, wherein the Faraday enclosure comprises a first input pinhole;
a sensor positioned outside of the Faraday enclosure and aligned with the first input pinhole for sensing microwave-frequency fields; and
a receiver inside the Faraday enclosure aligned with the first input pinhole and the sensor for responding to the sensor, wherein the sensor comprises of a gas lamp and the receiver comprises of a photovoltaic transistor, and wherein the microwave energy detector further comprises:
a microprocessor communicatively coupled to the photovoltaic transistor to store information corresponding to responses by the photovoltaic transistor to light from the gas lamp and comprising an optical serial output;
a clock connected to the microprocessor to align responses received by the microprocessor from the photovoltaic transistor to light from the gas lamp with a point in time;
nonvolatile memory connected to the microprocessor for storing information from the microprocessor;
wherein the Faraday enclosure further comprises a first output pinhole, wherein the optical serial output of the microprocessor is aligned with the first output pin hole of the Faraday enclosure, and wherein the Faraday enclosure completely surrounds and encloses the photovoltaic transistor, the microprocessor, the clock, and the non-volatile memory to shield the same from EM fields outside the Faraday enclosure.

16. A microwave energy detector comprising:
a Faraday enclosure for substantially attenuating microwave-frequency fields outside the Faraday enclosure, wherein the Faraday enclosure comprises a first input pinhole;
a sensor positioned outside of the Faraday enclosure and aligned with the first input pinhole for sensing microwave-frequency fields; and
a receiver inside the Faraday enclosure aligned with the first input pinhole and the sensor for responding to the sensor, wherein the first input pinhole is sized to correspond to 1/10 of a wavelength of a highest frequency of potential damage risk due to application of the microwave-frequency fields.

17. The microwave energy detector of claim 16, wherein the first input pinhole has a diameter less than or equal to 0.010 inches.

18. The microwave energy detector of claim 1, and further comprising a protective and portable case encapsulating the Faraday enclosure and the sensor.

19. The microwave energy detector of claim 1, wherein the receiver comprises of a photovoltaic transistor, and wherein the sensor comprises of a gas lamp assembly comprising a gas lamp comprising a sealed bulb containing a gas with pair of leads extending from the sealed bulb wherein the gas inside the sealed bulb glows in the presence of an microwave-frequency field exceeding a threshold level, wherein the sealed bulb of the gas lamp is oriented proximate to the first input pinhole and the pair of leads extend away from the Faraday enclosure.

20. The microwave energy detector of claim 19, wherein the gas lamp assembly further comprises of a microwave-frequency translucent, light opaque shield around the glass bulb and a Faraday sleeve over an outer portion of the glass bulb and the pair of leads to tune the threshold level of the sensor.

* * * * *